United States Patent [19]

Olsson

[11] Patent Number: 4,578,745

[45] Date of Patent: Mar. 25, 1986

[54] SEMICONDUCTOR VALVE

[75] Inventor: Karl-Erik Olsson, Ludvika, Sweden

[73] Assignee: ASEA AB, Vasteras, Sweden

[21] Appl. No.: 656,847

[22] Filed: Oct. 2, 1984

[30] Foreign Application Priority Data

Oct. 6, 1983 [SE] Sweden ................... 8305503

[51] Int. Cl.$^4$ .................. H02M 1/00; H01L 1/00
[52] U.S. Cl. .................... 363/68; 363/141; 338/55
[58] Field of Search ............ 363/68, 141; 338/55; 361/382, 385; 357/75, 76, 81, 82

[56] References Cited

U.S. PATENT DOCUMENTS 4,178,630 12/1979 Olsson .................. 363/141
4,420,739 12/1983 Herren .................. 338/55
4,475,152 10/1984 Ikegame et al. .......... 363/141

*Primary Examiner*—Peter S. Wong
*Assistant Examiner*—Judson H. Jones
*Attorney, Agent, or Firm*—Pollock, Vande Sande & Priddy

[57] ABSTRACT

A high voltage semiconductor valve has a plurality of electrically series-connected semiconductor elements, for example thyristors or diodes. These are designed for pressure contact connection and for double-sided cooling and are arranged alternately with liquid cooling bodies in a stack. At least some of the resistors included in the voltage divider of the valve are arranged with their resistive portions located in a passage in the cooling body between the contact surfaces for the two adjacent semiconductor elements.

10 Claims, 15 Drawing Figures

SEMICONDUCTOR VALVE

BACKGROUND OF THE INVENTION

1. Field of the Invention

This invention relates to a semiconductor valve for high voltage applications, comprising a plurality of electrically series-connected semiconductor elements and a plurality of cooling bodies adapted to be traversed by a liquid coolant, the semiconductor elements and the cooling bodies being arranged in a stack in such a way that each semiconductor element is arranged between two cooling bodies. The semiconductor valve also includes a pressure means arranged to generate a compressive force acting on the cooling bodies and semiconductor elements in the longitudinal direction of the stack. The semiconductor valve also includes voltage divider sections which are connected in parallel with each semiconductor element, each voltage divider section comprising at least one resistor.

2. Description of the Prior Art

Semiconductor valves of the above-mentioned kind are previously known from Mellgren et al. U.S. Pat. No. 3,536,133. Such valves are used, for example, in convertors for HVDC power transmission systems, or as parts of the switching member used for static reactive power compensation.

In semiconductor valves of the above-mentioned kind, the voltage divider sections form a chain arranged in parallel with the individual semiconductor elements in such a way that each element is parallel-connected to a voltage divider section. Each such voltage divider section normally includes one or more resistors. Valves with such voltage divider sections are previously known, for example, from U.S. Pat. Nos. 3,794,908 and 4,360,864.

The resistors or the voltage divider sections have a high power dissipation, typically of the order of magnitude of several hundred watts. IF the resistors are air-cooled, this has several serious disadvantages. The resistors have to be provided with cooling flanges, or the like large surface area structures, so as to ensure adequate heat emission to the surrounding air and prevent too great a temperature rise. Further, it is necessary to ensure that there is a sufficient flow of cooling air past the resistors in order to carry away the waste heat. For these reasons, a semiconductor valve of the above-described kind, if provided with air-cooled resistors, tends to become relatively bulky. An additional disadvantage is that the emission of power from the resistors will be high, which results in a high air temperature in the valve and in the surrounding environment and, therefore, an increased ambient temperature for other components and equipment disposed adjacent to the semiconductor valve, if special additional cooling measures are not taken.

It is previously known, for example from U.S. Pat. No. 2,274,381, to liquid-cool high-power resistors. However, making each of the many resistors in the voltage divider sections of a semiconductor valve of the kind described liquid-cooled, would result in a complicated valve having many connections and conduits for the liquid coolant. With these coolant conduits, the semiconductor valve would still be relatively bulky and there would still be some heat emission from the resistors and the coolant conduits that would raise the ambient temperature in the vicinity of the valve.

From U.S. Pat. No. 4,178,630 it is previously known to mount the resistors forming the voltage divider section on a cooling bar for the semiconductor elements of the valve, which cooling bar is provided with means permitting it to be cooled with a liquid coolant. A certain proportion of the waste heat from the resistors will then be extracted by the liquid coolant which traverses the cooling bar, but the heat emission to the surrounding air will still be relatively high.

OBJECT OF THE INVENTION

One object of this invention is to provide a simple and compact semiconductor valve of the kind described in the opening paragraph of this specification, which has a minimum of thermal emission from the resistors of the voltage divider sections to the surrounding air.

SUMMARY OF THE INVENTION

A semiconductor valve in accordance with this invention is characterized in that at least one of the resistors of the voltage divider section is of enclosed design and of substantially elongated cylindrical shape. The said at least one resistor is arranged with at least its main portion located inside one of said cooling bodies of the stack of the valve and with its longitudinal axis substantially perpendicular to the longitudinal axis of the stack.

BRIEF DESCRIPTION OF THE DRAWINGS

The invention will now be described in greater detail, by way of example, with reference to the accompanying drawings, in which.

DESCRIPTION OF THE PREFERRED EMBODIMENTS

Figure 1A:
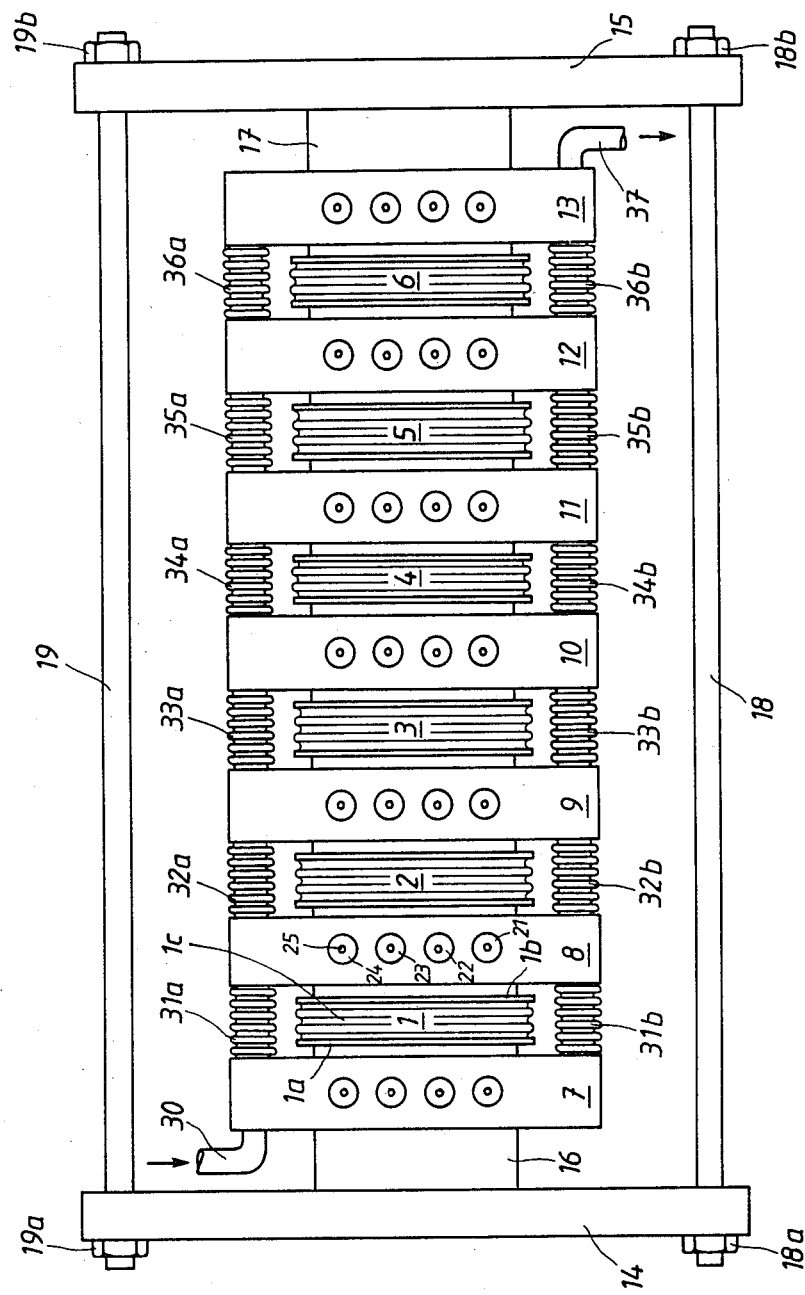
FIGS. 1a and 1b show a first embodiment of semiconductor valve according to the invention.
Figure 1B:
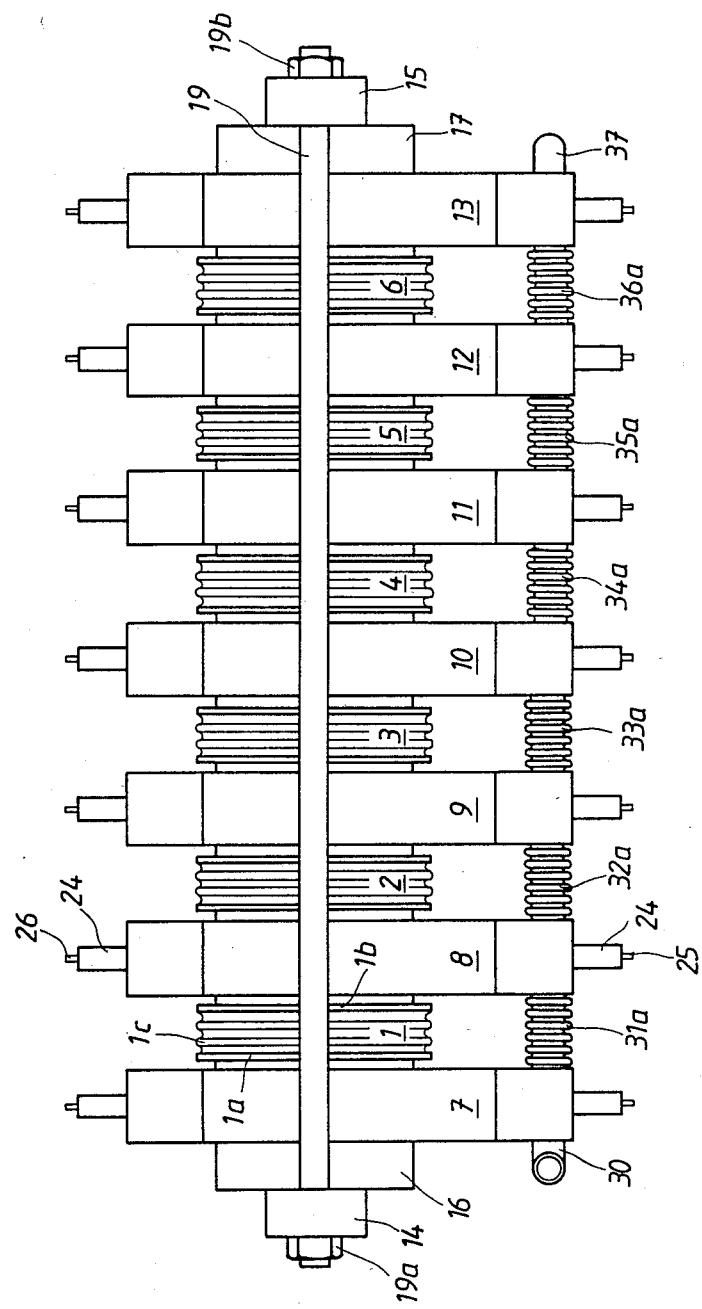

FIGS. 1a and 1b show one example of a semiconductor valve according to the invention, seen in two directions perpendicular to each other, both directions being perpendicular to the longitudinal axis of the valve. The valve has six semiconductor elements 1–6, which may be thyristors or diodes. The housing of each semiconductor element includes two circular metallic contact plates (1a and 1b in the case of semiconductor element 1) and an annular insulator (1c) located therebetween. The semiconductor elements are each designed for pressure contact and for cooling from two sides, that is, they are each intended to be compressed between two cooling bodies arranged one on each side of the semiconductor element. Between each pair of semiconductor elements, and outside the two outermost semiconductor elements, cooling bodies 7–13 are arranged. The stack formed by the cooling bodies and the semiconductor elements is compressed in the axial direction of the valve with the aid of yokes 14 and 15, pressure transmitting bodies 16 and 17, and bolts 18 and 19 with their screw-threaded nuts 18a, 18b, 19a, 19b. The generated compression force is relatively high, for example one or a few tens of thousands of Newtons. The compression ensures there is mechanical stability in the stack as well as good electrical and thermal contact between the semiconductor elements and the cooling bodies. Since a high electrical voltage will be applied between the two ends of the valve during use, the clamping means 14-19 must be designed so as not to create an electric short-circuit between the opposite ends of the valve. This may be achieved, for example, by locating electrically insulating plates between the bodies 16, 17 and the cooling bodies 7, 13, or by electrically insulating the bolts 18, 19 and the nuts 18a, 19b from the yokes 14, 15.

The necessary conductors for electric connection of the valve have not been shown but may, for example, be connected to the cooling bodies 7 and 13.

A tube 30 is connected to the cooling body 7 for the supply thereto of a liquid coolant, for example water. The tube 30 and electrically insulating connecting tubes 31a-36a are arranged in line with each other and are in fluid connection with each other via holes arranged in the cooling bodies 7-13. A discharge tube 37, for removal of the liquid coolant, is connected to the cooling body 13. In line with this tube are electrically insulating connecting tubes 31b-36b connected to each other via further holes in the cooling bodies 7-13. The tubes 31a-36a and the holes in the cooling bodies disposed in line therewith together form a supply conduit for the cooling liquid. In the same way, the tubes 31a-36b and 37 and the aligned holes in the cooling bodies form a discharge conduit for the cooling liquid. From the supply conduit, coolant flows, in parallel, through channels in each of the seven cooling bodies to the discharge conduit, where the liquid collects for discharge via the tube 37.

At least some of the resistors of the voltage divider sections of the valve, preferably those having the greatest amount of power to dissipate are located in a metal enclosure. In the illustrated embodiment in FIGS. 1a, 1b each resistor element is centrally arranged within an elongated cylindrical tube and is insulated from the metal tube by means of a suitable insulating compound. As shown in FIG. 1a, four resistors of this kind are arranged in each of the cooling bodies 7-13. The resistors which, for example, are arranged in the cooling body 8 are designated 21-24. The resistors are so long that they protrude somewhat on either side of the cooling bodies and their electrical connections (25 and 26 for resistor 24) are thus easily accessible for electrical connection thereto. As will be described in greater detail in the following, channels are arranged inside each cooling body in such a way that the resistors therein are surrounded by the liquid coolant flowing through the cooling bodies.

Figure 2A:
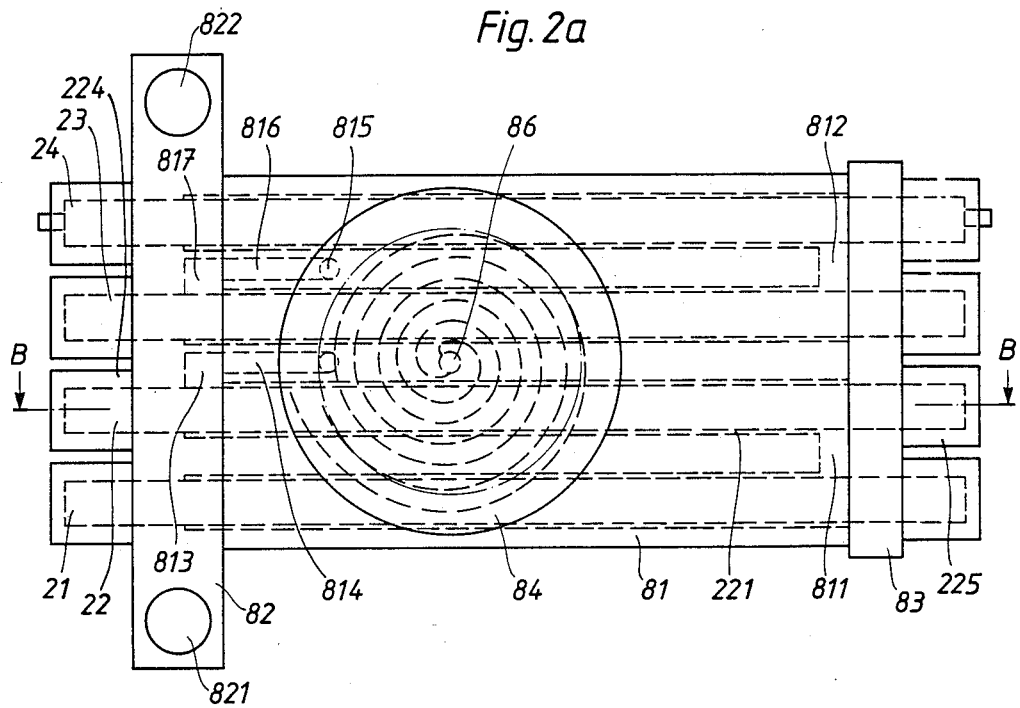
FIGS. 2a, 2b and 2c show in more detail the cooling body employed in the semiconductor valve shown in FIGS. 1a and 1b, FIGS. 3a, 3b, 3c and 3d show an alternative embodiment of the cooling bodies for the valve shown in FIGS. 1a and 1b, FIGS. 4a, 4b and 4c show a further embodiment of valve with the resistors arranged in separate plates.
Figure 2B:
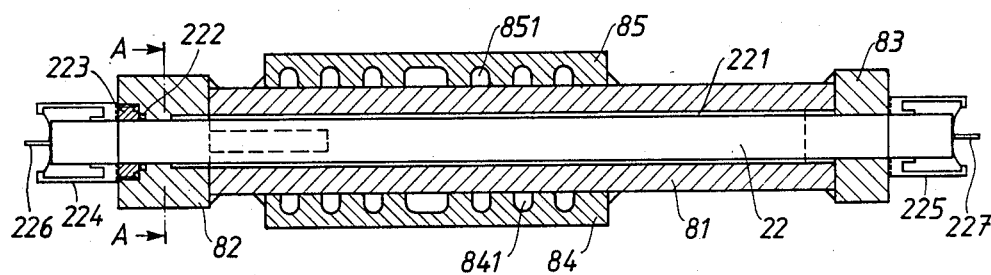
Figure 2C:
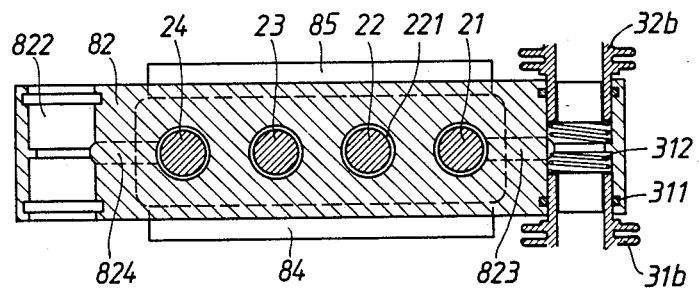

FIGS. 2a-2c show in more detail one embodiment of the cooling bodies, namely the cooling body 8 in FIGS. 1a and 1b. The other cooling bodies are identical with that shown in FIGS. 2a-2c. FIG. 2a shows the cooling body seen in the longitudinal direction of the valve stack; FIG. 2b shows a section on the line B—B in FIG. 2a, and FIG. 2c shows the section on the line A—A in FIG. 2b. In a known manner the cooling body is made of a metal having suitable mechanical, electrical and thermal properties, for example copper, a light metal or a light-metal alloy. The cooling body has a main portion 81 and two end pieces 82 and 83. The main portion 81 of the cooling body is, in principle, a solid parallelepipedic body which is provided with four parallel longitudinal passages one for each of the resistors 21-24. The passage provided for the resistor 22 is designated 221 in FIGS. 2a-2c. Each passage has a somewhat larger diameter than the external diameter of the resistor to fit therein, and therefore annular channels are formed between each resistor and the walls of its respective passage, allowing liquid coolant to traverse these channels in the longitudinal direction of the resistors. At the right-hand end as shown in FIG. 2a, the main portion 81 is provided with recesses 811 and 812, which enable coolant to flow between the passages for resistors 21 and 22 and between those for resistors 23 and 24, respectively. On either side of the main portion 81 of the cooling body, two cooling plates 84 and 85 are arranged. These are each provided with helical cooling liquid channels 841 and 851, respectively. The two ends of the cooling channels 841 and 851, which are located at the centers of the cooling plates, are connected to each other via a hole 86 extending right through the main portion 81. The peripheral end of the channel 841 is connected to the interior of the body 8 via a hole 815 arranged in the main portion 81 and a channel 816 running out into the left-hand end of the body 8 shown in FIG. 2a. In a corresponding way, the peripheral part of the channel 851 is connected into the cooling liquid flow via a hole 814 and a communicating channel which opens out into the left-hand end of the main portion 81 shown in FIG. 2a. The end piece 82 is fixedly connected to the main portion 81 and is provided with bores for the resistors 21-24. In their parts located nearest to the main portion 81 these bores have a larger diameter than the resistors to enable a coolant to flow past them. In their parts facing away from the portion 81, the bores suitably have a smaller diameter and are provided with sealing members for sealing against outflow of coolant. As shown in FIG. 2b, these sealing members can suitably consist of an O-ring 222 and a nut 223. The electrical connections of the resistor 22 are designated 226 and 227 in FIG. 2b. For increasing the electrical creep distance between the connections and the cooling body, cylindrical screens 224 and 225 can be placed around each end of each resistor.

To allow cooling liquid to be supplied to the cooling bodies, the end piece 82 is provided with a bore 822 which, via the insulating tubes 31a and 32a in FIG. 1a, is connected to the supply conduit 30. From the bore 822 a channel 824 extends to the cooling liquid passage which surrounds the resistor 24. At its opposite end, the end piece 82 is provided with a second bore 821 for discharge of liquid coolant, and this bore is connected, via the insulating tubes 31b and 32b, to the adjacent cooling bodies and ultimately to the discharge tube 37. FIG. 2c shows one example of how the electrically insulating tubes 31b and 32b may be sealingly connected to the end piece 82 with the aid of O-rings (311) and helical springs (312). The bore 831 is connected via a channel 823 to the cooling liquid passage which surrounds the resistor 21.

The end piece 83 is fixed to the right-hand end of the main portion 81 as shown in FIG. 2a. This end piece contains no cooling liquid channels, but is provided with four holes to receive the respective one of the four resistors 21-24. The end piece 83 is provided with sealing members for the coolant, for example of the same kind as those shown on the end piece 82 in FIG. 2b.

The liquid coolant which is supplied to the cooling body 8 via the hole 822 makes the following circuit. Via the channel 824 the liquid flows to the left-hand end of the passage which contains the resistor 24 and thereafter flows around this resistor in the axial direction of the right-hand end of the passage. Via the recess 812, the liquid flows into the passage which surrounds the resistor 23 and flows around this resistor to its left-hand end. Via the recess 817, the channel 816 and the hole 815, the liquid thereafter flows up to the peripheral end of the helical channel 841 in the cooling plate 84. After having traversed the latter channel, the liquid flows from the central end point of the channel through the hole 86 down to the central end of the channel 851 in the opposite cooling plate 85. After having traversed this latter channel, the cooling liquid flows via the hole 814 and the recess 813 to the left-hand end point of the passage 221 which contains the resistor 22 and then follows passage 221 in the longitudinal direction of the resistor. At the end of the passage (shown as the right-hand end in FIG. 2a), the cooling liquid flows through the recess 811 and into the passage which surrounds the resistor 21 and flows around this resistor to its left-hand end and then flows via channel 823, to the hole 821, which, as described above, is in communication with the discharge tube 37.

Any additional voltage divider components and electronic components for supply, control and protection of the semiconductor elements can suitably be located on the cooling body, suitably between the cooling plates 84 and 85 and the end piece 83. Cooling of these components as well is obtained in this way.

The semiconductor valve described above exhibits a combination of properties which make it extremely advantageous compared with prior art valves. Due to the short heat transport paths between the coolant flowing in the cooling plates 84 and 85 and the semiconductor element, a most efficient cooling of the element is obtained. Further, practically all of the thermal power developed in the resistors will be directly passed to the liquid coolant, and the emission of waste heat to the surrounding atmosphere is practically completely eliminated. The considerably reduced thermal emission to the ambient air makes possible a more compact mode of construction than what has been possible previously, and further ensures a lower running temperature for the valve and an enhanced reliability for other electronic components arranged adjacent to the valve since these are no longer stressed by the waste heat from the valve. These advantages are obtained by virtue of the use of a cooling body, which occupies a space not much larger than a cooling body intended only for cooling the semiconductor element, and which occupies a considerably smaller space than if a separate liquid cooler were to be arranged for the resistors of the voltage divider sections. For the same reason the weight of a semiconductor valve as described above will be considerably lower than what has previously been possible to achieve with a valve having corresponding operating parameters. Further, the number of pipe fittings, hose connections, etc., is reduced to a minimum in the semiconductor valve described, thus enabling the simplest possible installation and a low risk of leakage. As will be clear from the cross sections in FIGS. 2b and 2c, the cooling body 8 shown in FIG. 2a has an abundance of solid material between the cooling passages, which is capable of absorbing the high compressive forces on the valve/cooling body stack without deformation occurring. This is essential if good electrical and thermal contact between the semiconductor elements and the cooling bodies is to be maintained. Furthermore, as will be clear from FIG. 2b, installation and removal of the resistors 21-24 arranged in the cooling body are extremely simple, which is important both for a lower unit cost on manufacture of the valve and for economic subsequent inspection and/or replacement of a resistor.

Figure 3A:
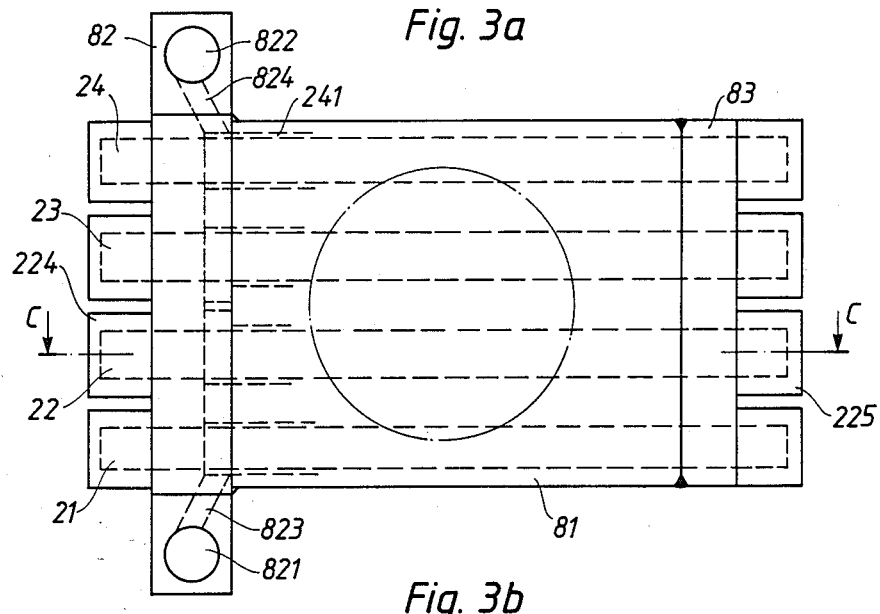
Figure 3B:
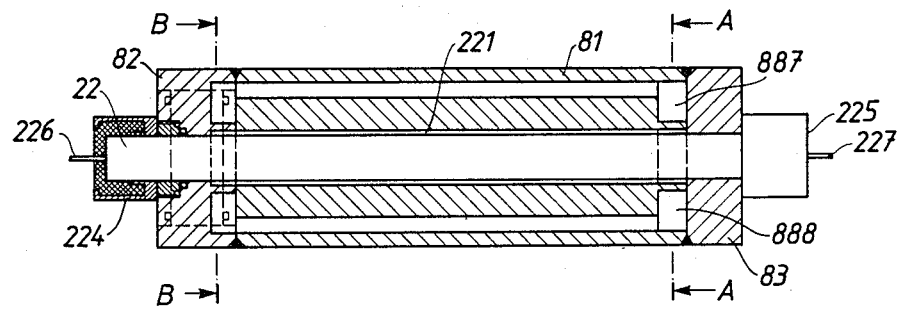
Figure 3C:
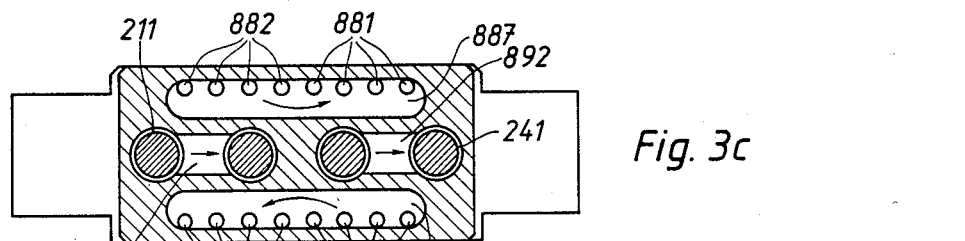
Figure 3D:
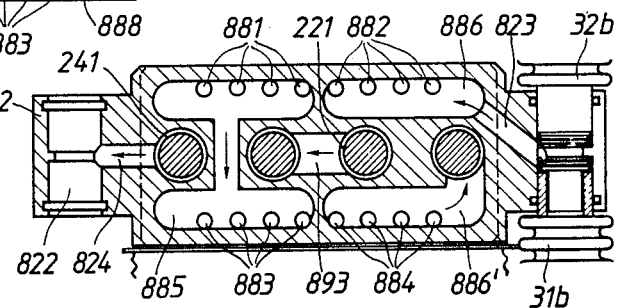

FIGS. 3a-3d show an alternative embodiment of a cooling body. FIG. 3a shows the cooling body seen in the longitudinal direction of the valve stack. FIG. 3b shows a section on the line C—C in FIG. 3a, and FIG. 3c and FIG. 3d show sections on the lines A—A and B—B in FIG. 3b, respectively. The difference between the cooling bodies shown in FIGS. 2a and 3a is that the cooling body according to FIG. 3a is not provided with the cooling plates 84 and 85 but instead of these, is provided with cooling channels 881, 882, 883, 884, located near the surface of the cooling body, for efficient cooling of the semiconductor elements. In consequence, the coolant paths in the cooling body are formed differently to what has been described above with reference to FIGS. 2a-2c. At that end of the main portion 81 of the cooling body which is shown as the right-hand end in FIG. 3a and FIG. 3b, recesses 887 and 888 are arranged, which have the shape shown in FIG. 3b and FIG. 3c. The recess 887 connects channels 881 with channels 882, and the recess 888 connects channels 883 with channels 884. Further, in the same way as in FIG. 2, recesses 891 and 892 are provided, which interconnect the cooling passages containing the resistors 21, 22 and 23, 24, respectively.

In the end piece 82, recessess 885, 886, 886', 893 and channels 824 and 823 are arranged. The recess 885 forms a connection between channels 881 and 883, the recess 886 forms a collection cavity for channels 882, the recess 886' forms a collection cavity for channels 884, the recess 893 connects the coolant passages around the resistors 22 and 23, the channel 823 serves as a supply tube to the collection cavity 886 and the channel 824 serves as a discharge tube from the cooling passage 241 around the resistor 24. The coolant flows from the inlet conduit 821 through channel 823, recess 886 and channels 882 to recess 887, where it flows over into channels 881 and via these to recess 885. Via the recess 885, the cooling liquid flows to channels 883, to recess 888 and via channels 884 to recess 886'. From recess 886 the cooling liquid flows through the passage 211 around the resistor 21, recess 891, passage 221 around the resistor 22, recess 893, the passage around the resistor 23, recess 892, the cooling passage 241 around the resistor 24 and via the channel 824 to the discharge conduit 822.

Figure 4A:
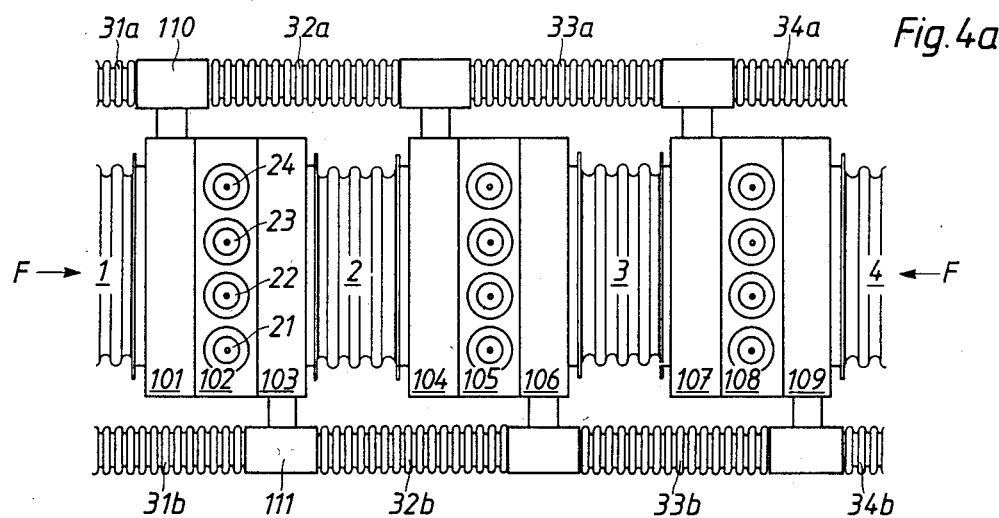
Figure 4B:
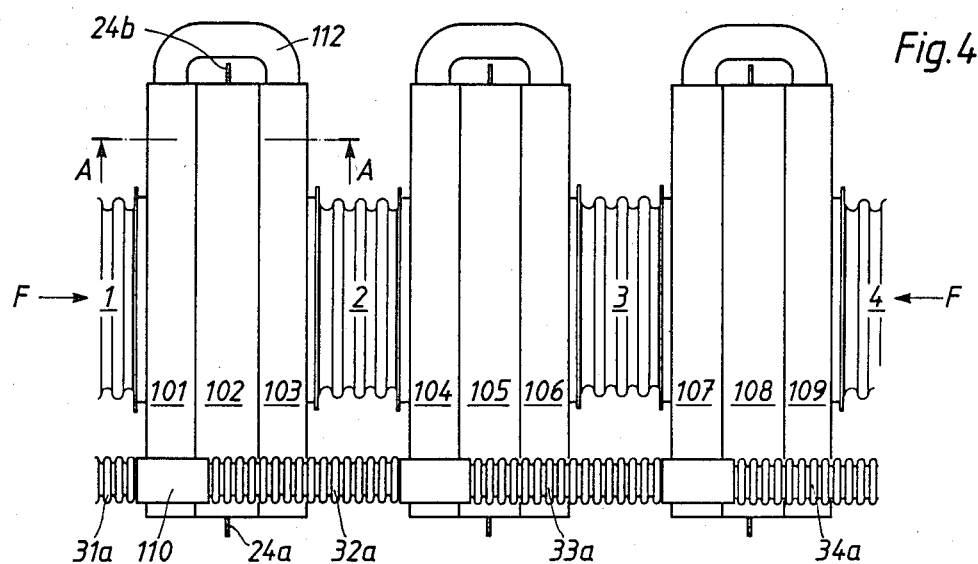
Figure 4C:
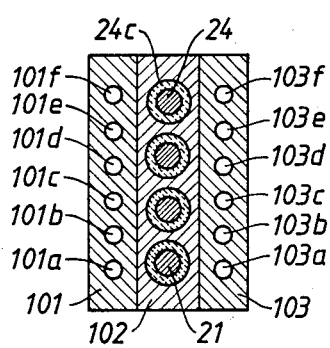

FIGS. 4a-4c show part of a modified stack of semiconductor elements/cooling bodies in a modified valve according to the invention. FIGS. 4a and 4b show part of the stack seen in two directions perpendicular to each other, and FIG. 4c shows the section on the line A—A in FIG. 4b. Between each pair of semiconductor elements (e.g. 1 and 2) there is a cooling body each of which includes a resistor plate 102, 105, 108 arranged between two cooling plates 101, 103, 104, 106; 107, 109. The resistor plates, as well as the cooling plates, each consist of parallelepipedic copper or other light-metal bodies. The cooling plates 101 and 102 are provided with a number of longitudinal, parallel cooling liquid channels 101a–101f and 103a–103f, respectively. The cooling plate 101 is provided with a supply tube 110 for the supply of liquid coolant. Supply tubes 110 for cooling plates 101, 104, 107, etc. are connected to each other by means of tubes 31a–34a of electrically insulating material and form together with these a supply conduit. Cooling plate 103 is provided with an outlet tube 111 for the coolant, which, via the insulating tubes 31b–34b, is connected to the outlet tubes of cooling plates 106, 109, etc. At both ends, each cooling plate is provided with a collection cavity for the coolant, which distributes the coolant to the parallel cooling channels and collects it from the channels, respectively. One tube 112, which suitably may be a metal tube fixedly connected to the cooling plates 101 and 103, connects the cooling channels in the two cooling plates.

Thus, coolant flows from the supply conduit through supply tube 110 to cooling plate 101, where it traverses channels 101a–101f. Via tube 112 the liquid flows to the cooling plate 103, where it traverses cooling channels 103a–103f and finally leaves the cooling plate through the outlet tube 111.

The resistor plate 102 is a separate plate which, in operation, is clamped between the cooling plates 101 and 103 by the axial forces F acting on the valve/cooling body stack. The plate 102 has four parallel through-passages for the resistors 21–24. Each resistor can be wire wound or of any other suitable resistance material and each can be fixed by being cast into the passages in the resistor plate with the aid of an electrically insulating compound (e.g. 24c) having sufficiently good thermal conductivity, for example a ceramic compound. The leads of the resistors, for example 24a, 24b, protrude on either side of the resistor plate to enable easy electrical connection to the resistors.

The other cooling bodies 104–106, 107–109, and so on, are formed in the same way.

In the same way as with the embodiments of the invention already discussed, the resistors 21–24 of the voltage divider sections are arranged in the central part of each cooling body. Through the forces F acting on the stack, the resistor plates 102, 105, 108 will be maintained in position and have good thermal contact with the adjacent cooling plates. Also in this case, efficient cooling of the resistors and a minimum heat emission to the surrounding air are obtained. In the valve stack shown in FIG. 4a, replacement of a defective resistor is an extremely simple operation. The only thing that needs to be done is to release the compressive force F and to detach the electrical connections to the resistors of the resistor plate in question, whereafter the resistor plate may be withdrawn and a new plate inserted. Further, the number of liquid couplings and seals are reduced to a minimum, which involves a low risk of coolant leakage.

Figure 5A:
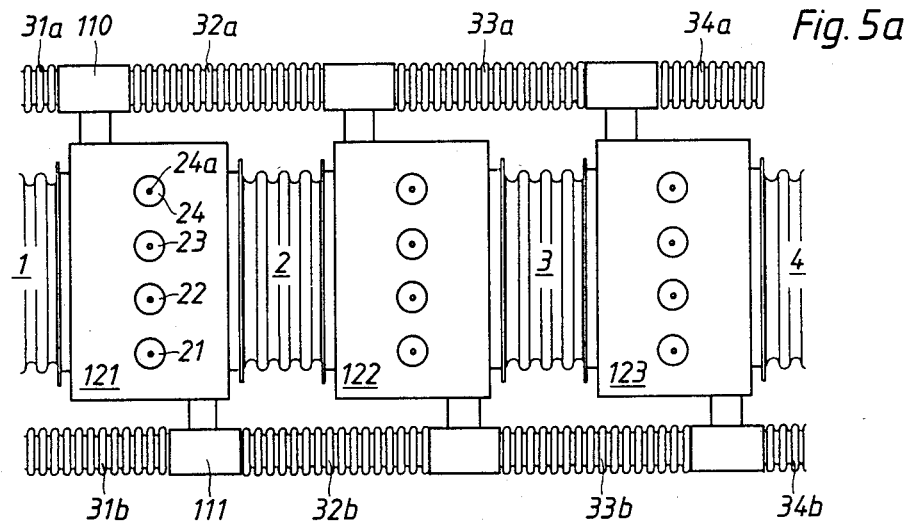
FIGS. 5a, 5b and 5c show a still further embodiment of valve with the resistors located in special holes in the cooling bodies.
Figure 5B:
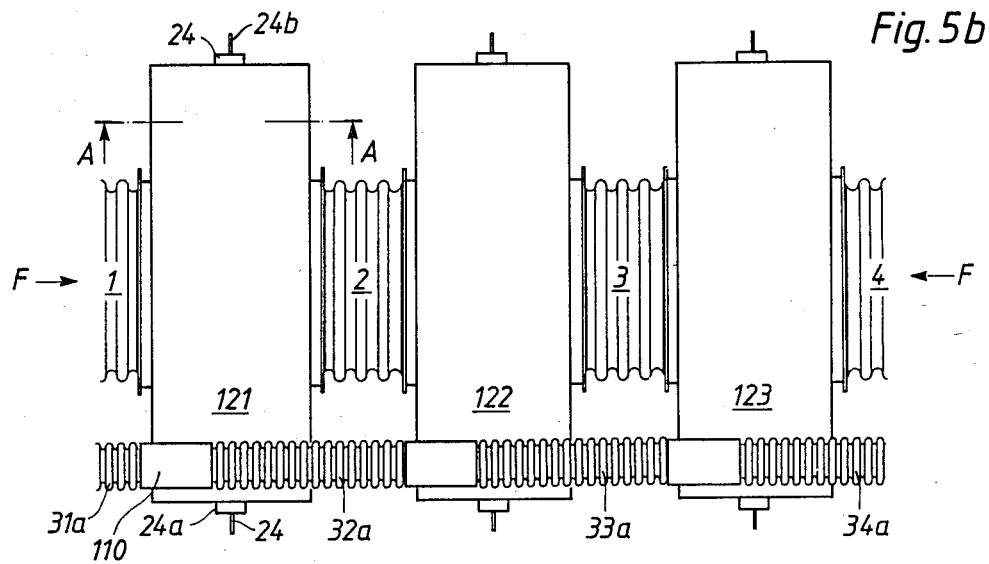
Figure 5C:
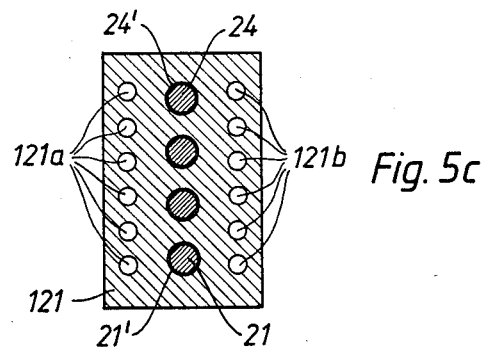

FIGS. 5a–5c part of a further stack of cooling bodies/semiconductor elements in a valve according to the invention. FIGS. 5a and 5b show the stack seen in two directions perpendicular to each other, and FIG. 5c shows the section on the line A—A in FIG. 5b. Between the semiconductor elements (e.g. 1 and 2) cooling bodies 121–123 are arranged, and the valve stack is clamped together by the axial force F generated by clamping members, for example of the kind shown in FIGS. 1a and 1b. Cooling body 121 has two sets of parallel cooling liquid channels 121a and 121b relatively close to the surfaces facing the semiconductor elements. From supply tube 110, the coolant flows via a collection cavity, arranged at one end of the body, through channels 121a to a collection cavity arranged at the opposite end and back through channels 121b and a collection cavity to the outlet tube 111. The resistors 21–24 of the voltage divider sections are arranged in four parallel passages 21'–24' in the cooling body. The resistors are preferably of a metal-enclosed design. To obtain a good thermal contact between the resistors and the cooling body, the resistors and the passages that contain them are suitably made with the smallest possible play, for example to a so-called "suction fit" (the play is greatly exaggerated in FIG. 5c). To improve the passage of heat between the resistors and the cooling body, heat-conducting pastes or powders may be used, for example silicone grease, carbon powder or metal powder. The use of such conducting pastes and/or powders permits a rather larger play to be tolerated for the resistors in the passages.

Instead of being cylindrical, the passages and resistors may be made somewhat conical, thus automatically obtaining a good thermal contact when the resistors are wedged into the passages.

As an alternative, to increase the contact surface and improve the passage of heat, the resistors and passages may be screw-threaded in such a way that each resistor can be screwed into its respective cooling body.

According to a further alternative, the play between the resistors and their receiving passages may be made so large as to accommodate an elastic, preferably a metallic spacer, for example a wave-formed resilient plate, which on the one hand maintains a compressive force between the resistor and the wall of the passage, and on the other hand, with a good thermal conductivity, transmits heat between the resistor and the cooling body.

The other cooling bodies in the valve stack shown in FIG. 5a are made in the same way as the cooling body 121 described above.

Again with this embodiment of the invention, the resistors are located in the central part of each cooling body and the same advantages are obtained as with the previously described embodiments. In addition, in the stack shown in FIG. 5a, each resistor may be replaced individually, and this can be done without loosening the compressive force F acting on the stack.

The embodiments of the invention described above are only examples of many that might have been given and, of course, a large number of other embodiments are feasible within the scope of the invention as defined in the following claims.

What is claimed is:

1. A semiconductor valve including
   a plurality of electrically series-connected semiconductor elements and a plurality of liquid-cooled cooling bodies,
   the semiconductor elements and the cooling bodies being arranged alternately one after the other in a stack having a longitudinal direction so that a semiconductor element is disposed between two cooling bodies,
   clamping means generating a compressive force acting in the longitudinal direction of the stack to press said elements and cooling bodies together, and
   voltage divider sections connected in parallel with each semiconductor element, each said voltage divider section including at least one resistor,
   characterized in that,
   at least one resistor of at least one voltage divider section has a main portion of elongated substantially cylindrical shape, which main portion is located inside one of said cooling bodies with its elongate direction substantially perpendicular to the longitudinal direction of the stack.

2. A semiconductor valve according to claim 1, in which in at least one cooling body in the stack, several resistors of a voltage divider section are arranged, one adjacent another, in a plane perpendicular to the longitudinal direction of the stack and with their elongate directions parallel.

3. A semiconductor valve according to claim 1, in which the ends of said at least one resistor project on either side of said one cooling body.

4. A semiconductor valve according to claim 2, in which said at least one cooling body has two parallel contact surfaces for engagement with semiconductor elements in the stack arranged on either side of the body, a central portion located between the contact surfaces, and, between each one of the contact surfaces and the central portion, a set of channels for cooling liquid, the resistors being mounted in the central portion of the cooling body.

5. A semiconductor valve according to claim 1, in which said at least one resistor is located in the cooling body in a passage open to a flow of cooling liquid.

6. A semiconductor valve according to claim 2, in which each of the resistors is located in a separate passage which has a larger cross sectional area than the main portion of the resistor it contains, each said passage being open to flow of cooling liquid in the elongate direction of the resistor it contains.

7. A semiconductor valve according to claim 4, in which the cooling body comprises three parts arranged one after the other in the longitudinal direction of the valve stack, each of the two outer parts located nearest the semiconductor elements having cooling liquid channels arranged therein, the central portion being detachable from the two outer portions on release of the clamping means and the central portion housing the resistors.

8. A semiconductor valve according to claim 7, in which the central portion is provided with a through-passage for each of the resistors, the resistive part of each resistor being spaced from the respective passage wall and between the said wall and the resistive part of the resistor, an electrically insulating material is located.

9. A semiconductor valve according to claim 4, in which the central portion of the cooling body is provided with a through-going bore, separated from the cooling liquid passages, for each of the resistors, each resistor being enclosed in metal and arranged in its passage in good thermal contact with the wall thereof.

10. A semiconductor valve comprising a plurality of semiconductor elements alternately sandwiched between cooling bodies to form a stack, the cooling bodies containing through-passages in which resistors of a voltage divider for the valve are located, the through-passages being connected to a liquid coolant inlet of the valve and a liquid coolant outlet of the valve.

* * * * *